United States Patent [19]
Forster et al.

[11] Patent Number: 5,763,851
[45] Date of Patent: Jun. 9, 1998

[54] SLOTTED RF COIL SHIELD FOR PLASMA DEPOSITION SYSTEM

[75] Inventors: John Forster, San Francisco; Aihua Chen, Fremont; Howard Grunes, Santa Cruz; Robert B. Lowrance, Los Gatos; Ralf Hofmann, San Jose; Zheng Xu, Foster City; Fernand Dorleans, San Francisco, all of Calif.

[73] Assignee: Applied Materials, Inc., Santa Clara, Calif.

[21] Appl. No.: 676,599

[22] Filed: Jul. 3, 1996

Related U.S. Application Data

[63] Continuation of Ser. No. 563,166, Nov. 27, 1995.
[51] Int. Cl.$^6$ ............................................. B23K 10/00
[52] U.S. Cl. .......................... 219/121.43; 219/121.41; 156/345; 315/111.51
[58] Field of Search ............................ 219/121.43, 121.4, 219/121.41, 121.52; 156/345, 646.1, 643.1; 204/298.19, 298.36, 298.37; 315/111.21, 111.51

[56] References Cited

U.S. PATENT DOCUMENTS

| | | | |
|---|---|---|---|
| 4,304,983 | 12/1981 | Pierfederici | 219/121.43 |
| 5,234,529 | 8/1993 | Johnson | 156/345 |
| 5,436,528 | 7/1995 | Paranjpe | 315/111.51 |
| 5,451,368 | 9/1995 | Jacob | 422/23 |
| 5,540,800 | 7/1996 | Qian | 156/345 |

*Primary Examiner*—Mark H. Paschall
*Attorney, Agent, or Firm*—Fish & Richardson P.C.

[57] ABSTRACT

A coil shield assembly for an RF field coil in a plasma processing system includes a first shield positioned inside the coil. The first shield has a central opening substantially surrounding a central space of a processing chamber in which the plasma is maintained. At least one slot is formed in the first shield and extends therethrough. A barrier is positioned between the first shield and the coil and spaced apart from the first shield near the at least one slot. The slot permits an RF signal from the coil to couple with the plasma, and the first shield and the barrier are structured and arranged to prevent plasma ions or sputtered material from bombarding the coil by a direct path from the central space and through the at least one slot.

64 Claims, 11 Drawing Sheets

SLOTTED RF COIL SHIELD FOR PLASMA DEPOSITION SYSTEM

This is a continuation of copending, application Ser. No. 08/563,166, filed on Nov. 27, 1995 now pending.

BACKGROUND OF THE INVENTION

The invention relates to a system for depositing a conductive material onto a semiconductor wafer or other workpiece by high-density plasma deposition, and more particularly to an apparatus having a shield for preventing short circuiting of the system caused by formation of a continuous metal film on the inner walls of the apparatus.

Physical vapor deposition (PVD) is a universal means for depositing thin films and coatings on semiconductor wafers or other workpieces. PVD is a vacuum deposition process where a coating of material is passed into a vapor transport phase by a physical mechanism, such as evaporation, sublimation or ion bombardment. Sputtering is one form of PVD wherein a material is dislodged and ejected from the surface of a solid or liquid due to the momentum exchange associated with surface bombardment by energetic particles. In a typical sputtering system, a source of coating material called the target is placed into a vacuum chamber along with a substrate, and the chamber is evacuated by a high vacuum and backfilled with a gas. This gas is partially ionized, and the ionized gas atoms are attracted to the target to physically eject particles of target material. The substrate is positioned in front of the target so that it intercepts a portion of the flux of sputtered atoms. In this traditional sputtering system, the target particles are ejected in paths ranging from nearly parallel, to perpendicular to the target. Thus, where a substrate is facing the target, many of the ejected particles will be travelling toward the substrate in non-perpendicular paths therewith. These particles can build up on the side wall of holes or trenches on the substrate, and block off the hole or trench before it is completely filled.

A coil fed with R.F. power may be wound about a portion of the sputtering chamber to form a plasma consisting of a mixture of gas and charged atomic particles dislodged from the target. The atomic particles are attracted to the substrate upon application of an opposite charge to the substrate, which causes them to bombard the substrate in paths substantially perpendicular thereto.

To enable inductive coupling between the coil and gas, the coil should be placed within the vacuum chamber with minimal or no barrier between the coil and the gas to be ionized. However, exposing an RF field coil to the plasma and material being sputtered from the target can have several deleterious effects. First, each of the plasma and sputtered material causes a heat load on the RF field coil that must be removed. Second, coil supports of RF feeds, which are typically made of an insulating material, can get coated with sputtered material, if the sputtered material is a metal, this can create resistive current paths that can interfere with operation of the RF field coil, resulting in inconsistent coupling efficiency and inconsistent process characteristics. Third, the RF field coil will become coated with sputtered material which flakes off during processing, which leads to process contamination or particle problems. Also, if high resistivity materials are being sputtered, such as Ti or TiN, there will be even higher resistive losses in the coil as it is coated.

A containment vessel or shield assembly may be interdisposed between the coil and the gas, to shield the coil from the plasma yet still enable energy from the coil to reach the substrate. However, once conductive target material forms a continuous path around the interior surface of the shield, the coil will inductively couple into the conductive film, thereby extinguishing the plasma.

The present invention solves these problems by providing a shield assembly for an RF field coil in a plasma processing system which protects the coil from the plasma and from bombardment with sputtered metal, and which also permits RF energy generated by the coil to pass through the shield assembly to couple with a plasma within the chamber.

Other advantages and features will become apparent from the following description of the preferred embodiments and from the claims.

SUMMARY OF THE INVENTION

In general, in one aspect, the invention is a plasma processing system including a vacuum chamber; an RF field coil surrounding a central space within the vacuum chamber, during plasma processing said RF coil coupling RF power into a plasma within the central space; and a coil shield assembly shielding the coil from the plasma. The coil shield assembly includes a first shield located inside the RF field coil, i.e., between the coil and the central space, and having at least one slot extending therethrough, and it includes a barrier structure positioned between the first shield and the coil and aligned with the at least one slot. The first shield and the barrier structure are structured and arranged to inhibit bridging of each slot by material deposited in the chamber during plasma processing.

In preferred embodiments, an inner surface of the barrier structure is spaced apart from the first shield proximal to the at least one slot, and positioned such that the surface of the barrier structure blocks all line-of-sight paths through the at least one slot between the central space and the coil. In addition, the at least one slot extends from a position proximate a top edge of the first shield to a position proximate a bottom edge of the first shield. Also, the at least one slot is part of a plurality of slots circumferentially spaced around the first shield, and each of the slots of the plurality of slots has a shape which is a member of the group of shapes consisting of an I-shape, a straight line shape, and a herring bone-shape. The barrier structure includes a second shield having a plurality of slots circumferentially spaced around the second shield and extending therethrough, and the plurality of slots in the second shield are circumferentially offset from the plurality of slots in the first shield, i.e., they are disposed at different radial paths from the center of the central space.

Also in preferred embodiments, at least one slot in the first shield extends completely through the first shield from top to bottom thereby splitting the first shield. Alternatively, the one slot in the first shield is a member of a plurality of circumferentially spaced slots which divide the first shield into individual segments which are electrically isolated from each other. In addition, the barrier structure includes a dielectric material and provides support to the first shield. The surface of the barrier structure includes a recess aligned with and proximate to the at least one slot of the first shield. Alternatively, the inner surface of the barrier structure is spaced apart from the first shield. Also in preferred embodiments, the barrier structure includes a second shield positioned between the first shield and the coil. The second shield includes at least one slot extending therethrough and which also extends from a position proximate a top edge of the second shield to a position proximate a bottom edge of the second shield. The at least one slot of the second shield is circumferentially offset from the at least one slot of the first shield. Also, the coil shield assembly includes a dielectric wall positioned between the second shield and the coil. In some embodiments, the dielectric wall forms a wall of the chamber so that the coil is located outside of the chamber. The first and/or second shield may be removeably positioned within the chamber. Additionally, the section of the chamber which houses the RF coil and coil shield assembly of the present invention may be a separable extension from the remainder of the chamber.

In still other preferred embodiments, the at least one slot extends in a generally circumferential direction around the first shield. Alternatively, the RF field coil and the at least one slot are circumferentially and axially aligned at a plurality of circumferentially spaced crossing points at which the at least one slot is substantially transverse to the RF field coil. For example, the RF field coil might be configured into a substantially rectangular-shaped pattern with the slot being substantially circular. Alternatively, the at least one slot might have a periodic rectangular-shaped pattern that is out of phase with the substantially rectangular-shaped pattern of the coil, or both the RF field coil and the slot could define substantially sawtooth-shaped patterns that are out of phase with each other.

In general, in another aspect, the invention is a plasma processing system for sputter depositing a material from a target onto a substrate. The plasma processing system includes a vacuum chamber; a platform which holds the substrate during plasma processing; a sputter source onto which the target is mounted; an RF coil located inside of the chamber and located between the target and the platform; and a coil shield assembly including a first shield located inside the RF coil and a barrier structure located between the first shield and the RF coil. The first shield includes at least one slot extending therethrough and the barrier structure is aligned with the at least one slot and spaced from the first shield proximal to the at least one slot such that there is no line of sight path from inside of the first shield to the RF coil.

In general, in still another aspect, the invention is a plasma processing system including a chamber for containing a plasma; an RF field coil positioned outside the chamber; and a coil shield assembly. The coil shield assembly includes a dielectric wall forming a portion of a wall of the chamber inside the coil; and a first metallic shield inside the chamber, the first shield being split by a first slot extending in an axial direction, wherein the first shield is spaced apart from an inner surface of the dielectric wall near the first slot.

In preferred embodiments, the plasma processing system further includes a second metallic shield positioned between the dielectric wall and the first shield and spaced apart from the first shield. In addition, the second shield is split by a second slot that is circumferentially offset from the first slot in the first shield. The first slot is one of a first plurality of slots that divide the first shield into a first plurality of circumferentially spaced segments. The second slot is one of a second plurality of slots that divide the second shield into a second plurality of circumferentially spaced segments. In addition, each of the first plurality of slots is circumferentially offset from each of the second plurality of slots. The first and second shields are electrically isolated from each other and from ground.

DESCRIPTION OF THE PREFERRED EMBODIMENTS

Figure 1:
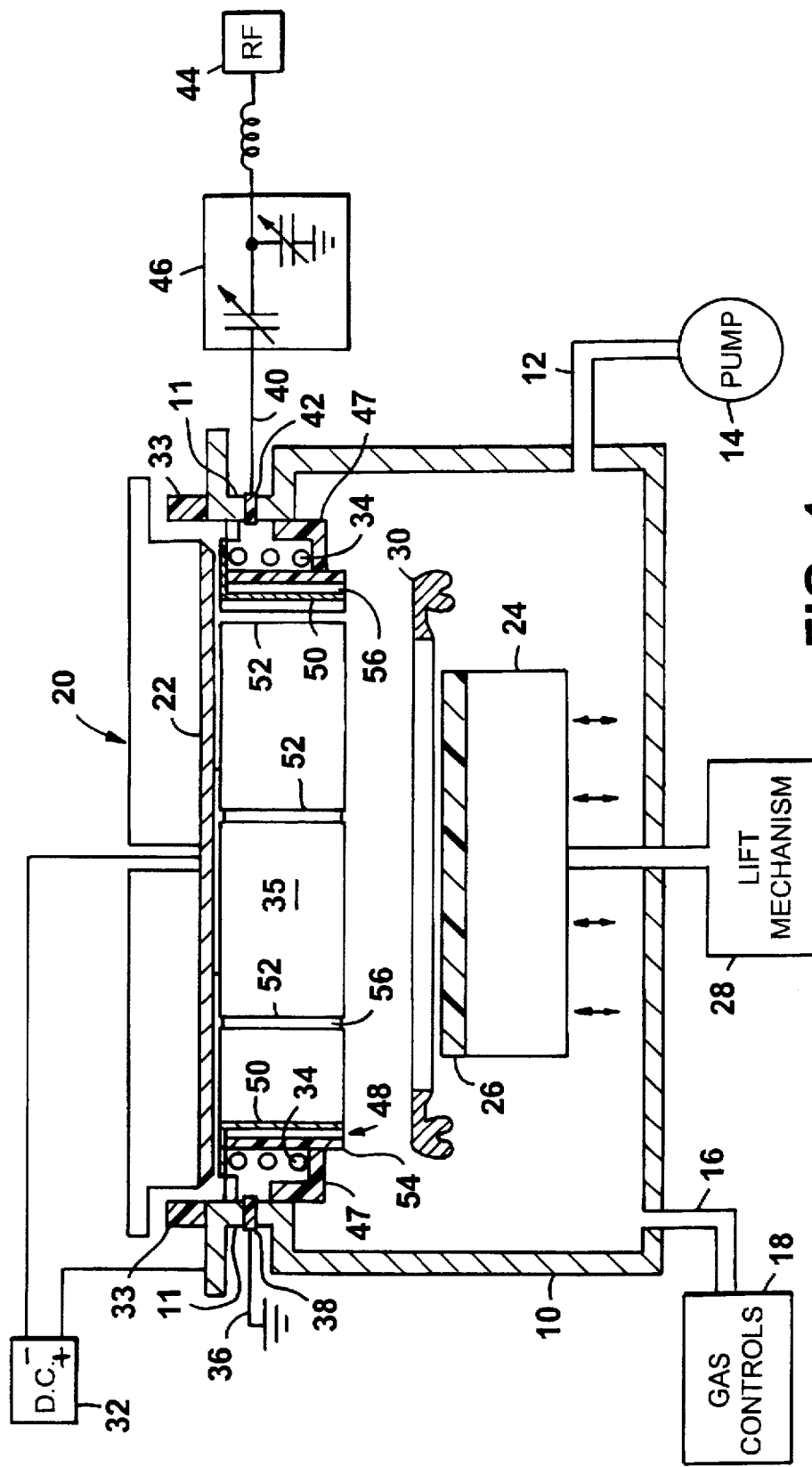
FIG. 1 schematically illustrates in a sectional view a sputter deposition chamber, including an RF field coil for inductively coupling to a plasma within the chamber and a coil shield assembly according to the invention.

FIG. 1 shows a plasma processing system used for sputter depositing a film of material onto a substrate. For simplicity of exposition, similar structures that are illustrated in different FIGS. will be referred to by the same reference numbers.

The plasma processing system includes a generally cylindrical chamber 10 having a first port 12 for evacuating chamber 10 with a pump 14 and a second port 16 for introducing process gas, such as, for example, argon, nitrogen, or reactive gases, from gas controls 18. A source assembly 20 at the top of chamber 10 has a sputter target 22 mounted thereto and facing downward into the interior of chamber 10. A movable platform 24 at the lower end of chamber 10 holds a substrate 26 onto which material sputtered from target 22 is deposited. Substrate 26 is typically a semiconductor wafer, however, the invention contemplates other types of substrates or other workpieces as well.

A lift mechanism 28 moves platform 24 up and down, as illustrated by arrows in FIG. 1. After substrate 26 is placed on platform 24, lift mechanism 28 raises platform 24 until the outer perimeter of substrate contacts a clamping ring 30. Clamping ring 30, which includes a central aperture that is slightly smaller than diameter of substrate 26, shields platform 24 from deposition material during processing.

A DC voltage power supply 32 coupled to target 22 provides power for initiating and sustaining a plasma deposition process. During sputtering, power supply 32 typically biases target 22 to a negative voltage relative to an electrical ground. In many applications, a metal portion of wall 11 of chamber 10 is grounded. Source assembly 20 and target 22 are electrically isolated from chamber 10 by an insulator ring 33. In the embodiment illustrated, source assembly 20 includes a magnetron that has several magnets (not shown) positioned behind target 22 for improving sputtering efficiency. In such a system, which is well known in the art, source assembly 20 includes a mechanism for rotating the magnets around the back of target 22 to improve the uniformity of erosion of target material during sputtering.

In some processes, it may be desirable to use another DC voltage source or RF generator circuit (not shown) connected to platform 24 to separately bias substrate 26.

A system for coupling RF energy to a plasma generated by source assembly 20 is referenced generally by the numeral 15, and includes an RF field coil 34. FIG. 1 illustrates coil 34 located inside an evacuated space of chamber 10 and generally surrounding a central space 35 located between target 22 and substrate 26. RF field coil 34 has two leads 36 and 40. Lead 36 is connected to ground through a feed-through 38 in wall 11 and lead 40 is connected to an RF generating circuit 44 through a second feed-through 42 and via an RF coupling network 46. An insulating support ring 47 supports coil 34 within chamber 10.

In the described embodiment, a coil shield assembly 48 is positioned generally inside RF field coil 34. Coil shield assembly 48 includes an inner shield 50 that is positioned close to, but separated from, RF field coil 34. Inner shield 50 may be metallic, or alternatively may be comprised of a non-conductive material such as ceramic or quartz. Inner shield 50 includes a plurality of evenly spaced slots 52 that are vertically aligned with the central axis of coil 34. Inner shield 50 prevents sputtered material from depositing onto coil 34 while slots 52 inhibit eddy currents in inner shield 50 that would attenuate the RF energy that penetrates into the central space 35 where it couples to the plasma.

An outer shield 54 is positioned between inner shield 50 and coil 34. Outer shield 54 has a surface 56 close to slots 52 but separated from inner shield 50 so that when sputtered material (e.g. metal) passing through slots 52 deposits onto surface 56, that material does not form an electrical short across the slot of inner shield 50 and eddy currents are thereby permitted to flow around inner shield 50. In the embodiment illustrated in FIG. 1, outer shield 54 is made of a dielectric material so that RF energy can pass through it into the central space 35 without being significantly attenuated. However, in alternative embodiments of the invention such as those described in greater detail below, outer shield 54 also has vertical slots, which are circumferentially offset from slots 52 of inner shield 50, and may also be made of metal.

Figure 2:
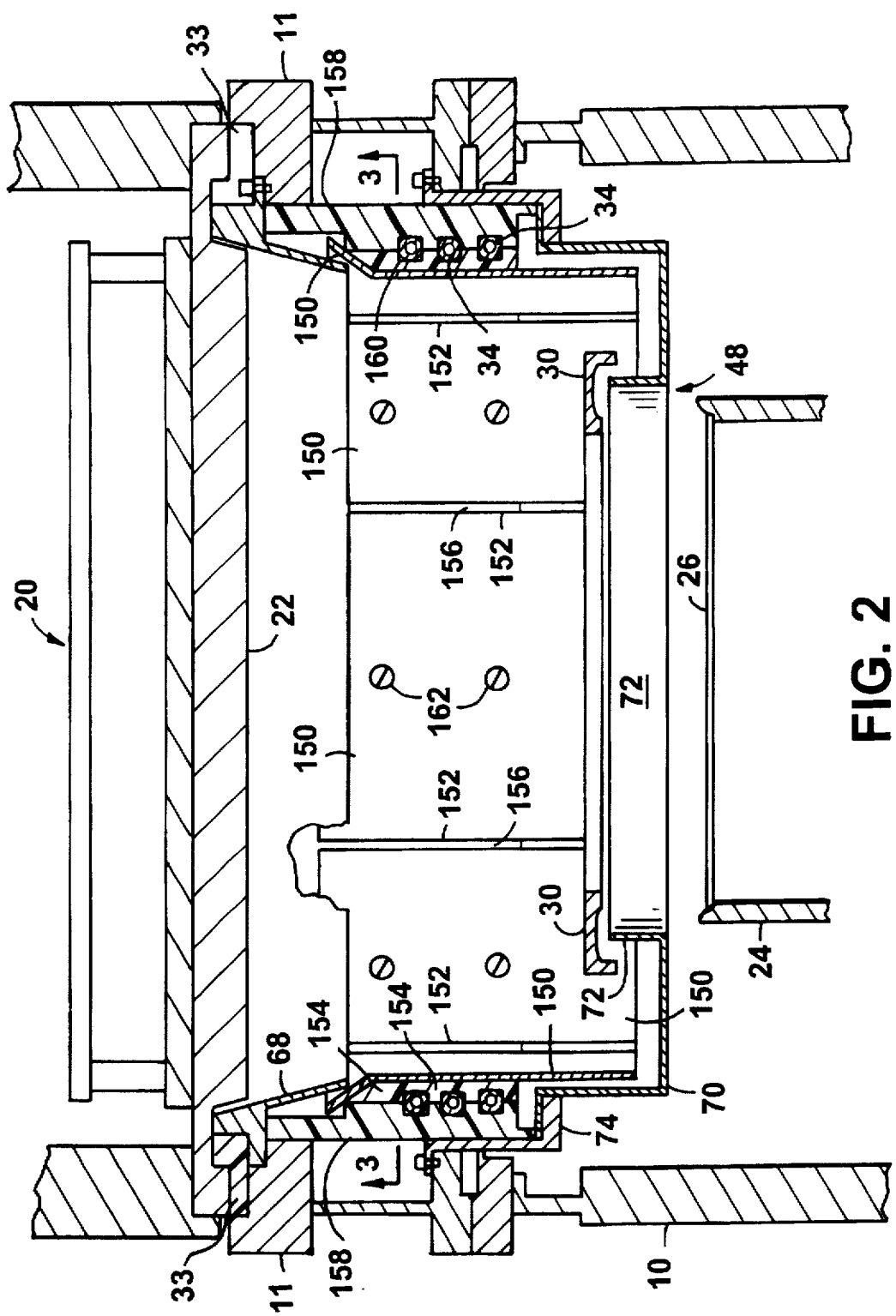
FIGS. 2 is a sectional view of a plasma deposition system schematically illustrating a chamber wall extension which houses an alternative embodiment of a coil shield assembly of the invention.

Referring now to an embodiment of the invention illustrated in FIG. 2, the entire RF energy supply system 15 for chamber 10 may be configured within a separable extension 10b of the chamber 10. In this alternative configuration, RF field coil 34 is embedded in outer shield 154. Outer shield 154 is preferably made of a dielectric material, and is attached to an insulating support 158 fastened to the wall 11 of chamber extension 10b. Chamber extension 10b attaches to and detaches from the stationary chamber 10a at point 13. Both the chamber wall extension 10b and the stationary chamber wall 10a are preferably formed of an insulating material such as ceramic or quartz. As the induction coil 34 is embedded within the chamber wall extension 10b, there is no need for a vacuum and water seal on the coil 34. The ability to disconnect chamber extension 10b from the stationary chamber 10a facilitates servicing and cleaning of the individual components of the system. This alternative configuration enables an existing standard sputtering chamber to be conveniently converted into an inductively coupled sputtering chamber, by the placement of such a chamber extension 10b having an RF energy supply system 15 as presently described, between a standard sputter chamber and a source assembly.

Figure 3A:
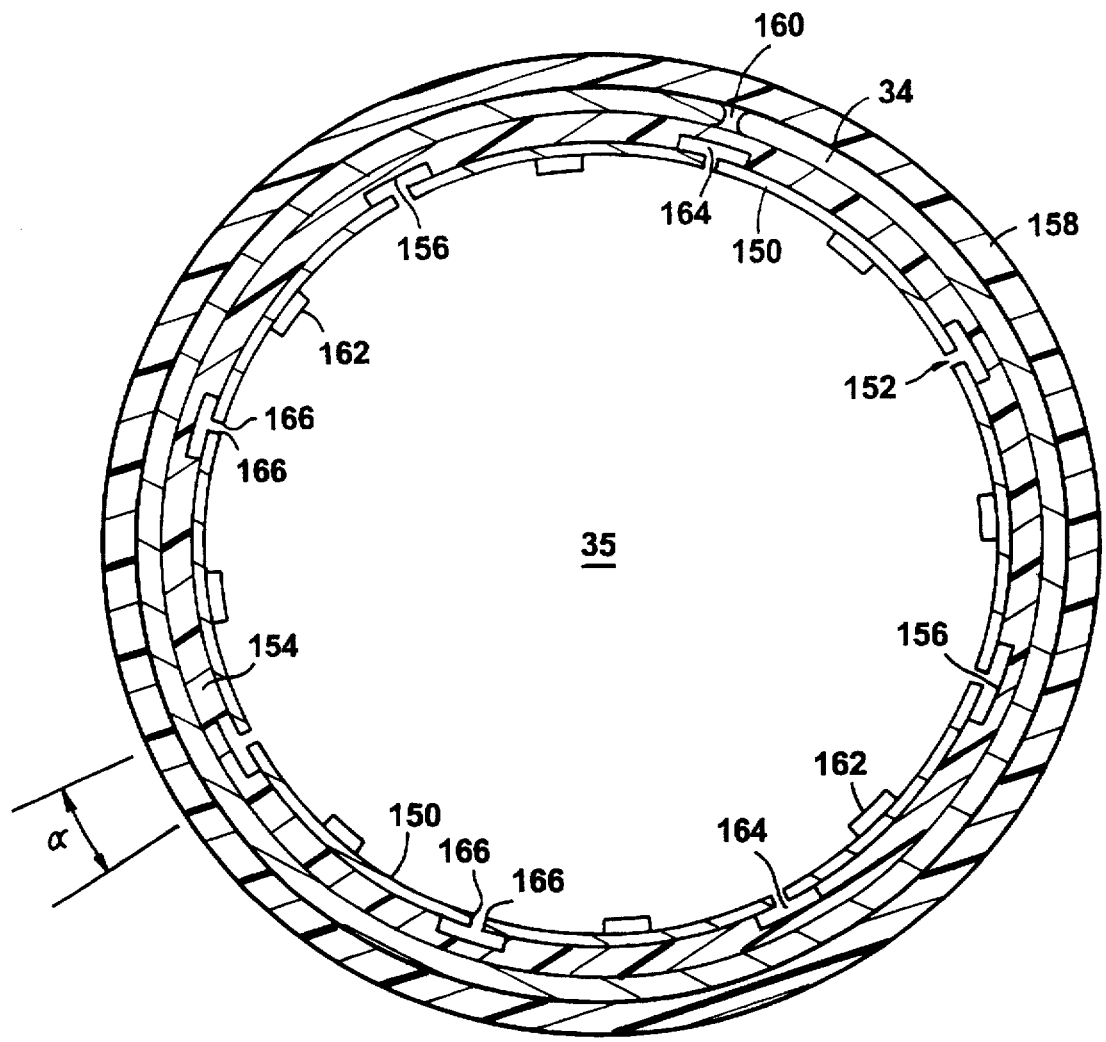
FIG. 3a is a sectional view of an alternative embodiment of the coil shield assembly of FIG. 2.

Alternatively, as illustrated in FIG. 3a, RF field coil 34 may be supported between insulating support 158, being generally tubular-shaped and having a diameter larger than RF field coil 34, and the outer shield 154, positioned radially inside the RF field coil 34. RF field coil 34 may be supported within grooves 160 formed in surfaces of one or both of support 158 and outer shield 154. Support 158 is fastened to chamber wall 11 such that RF field coil 34 is electrically isolated from the grounded chamber.

Inner shield 150 which may be metallic and which may include a plurality of slots 152, is mounted on an inner surface of outer shield 154 by fasteners 162 that also secure outer shield 154 to insulating support 158. Slots 152 extend completely through inner shield 150 from top to bottom such that inner shield 150 is divided into a plurality of discrete segments. The segments are electrically isolated from ground and from each other. Thus, there are no closed loop current paths around the inner shield 150 or between segments of the shield over which the RF field can induce eddy currents that reduce the coupling of the RF signal to the plasma within central region 35 inside inner shield 150.

Outer shield 154, being a dielectric or insulator material, is transparent to the RF signal generated by coil 34. Inner shield 150 protects an inner surface 156 of outer shield 154 from sputtered material from the target, except for a plurality of strips located behind slots 152. In order to prevent bridging of slots 152 with a layer of conductive sputtered material, which could electrically short the segments of inner shield 150 together, recesses 164 or grooves are formed in surface 156 behind each slot 152. Each recess 164 is aligned with a corresponding slot in inner shield 150 and is wider than the width of its corresponding slot. In other words, each recess 164 is wide enough circumferentially such that material deposited within recess 164 will not short the inner shield segments together.

Figure 3B:
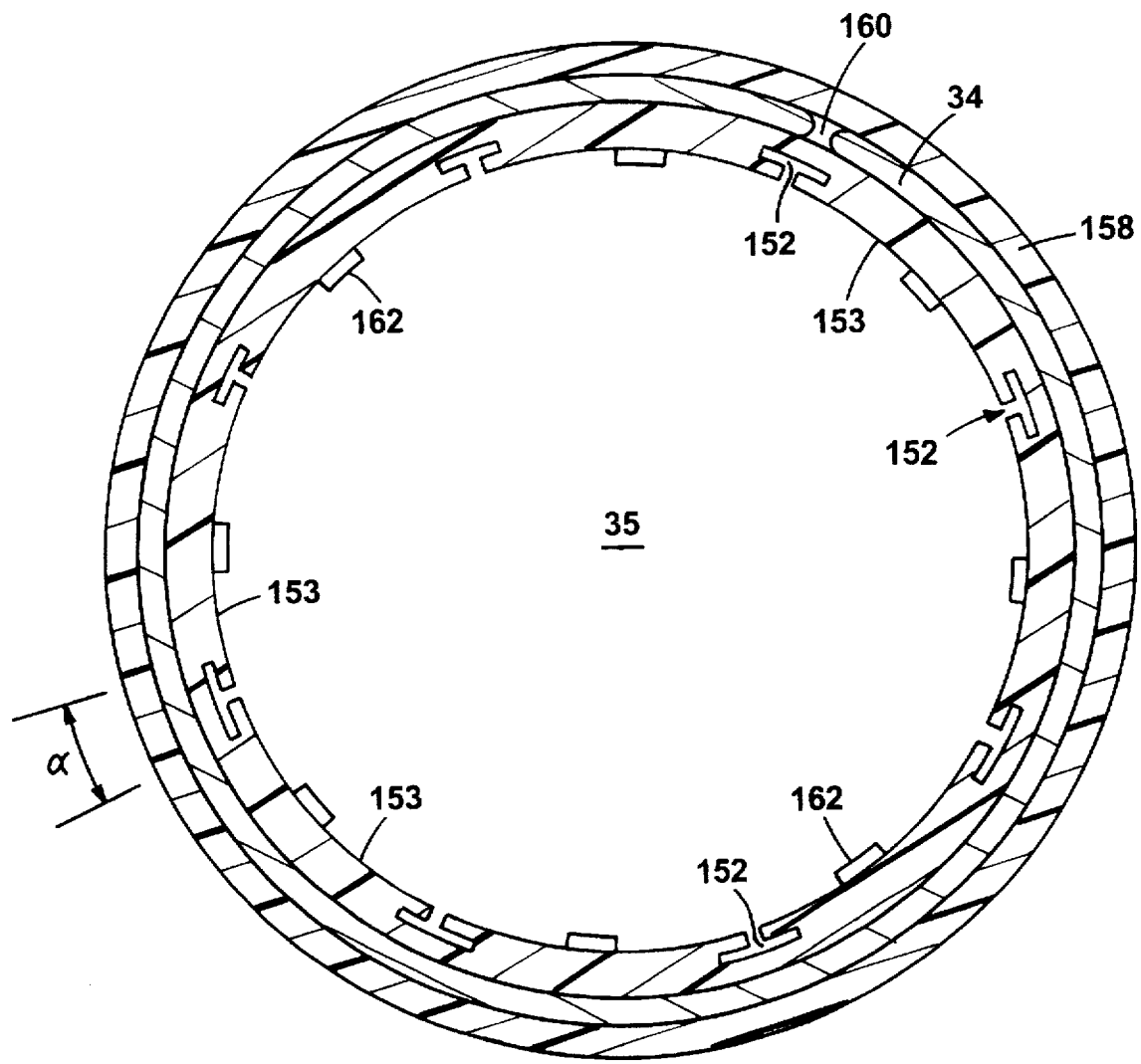
FIG. 3b is a sectional view of an alternative embodiment of the coil shield assembly of FIG. 2.

FIG. 3b illustrates an alternative embodiment of the coil shield assembly of the present invention, wherein the outer shield and inner shield are integrated to form a single shield 153 of a nonconductive material. The slots 164 formed within shield 153 are preferably T-shaped, such that formation of a continuous film of material deposited on the inner surface of the shield is prevented.

Referring again to FIG. 2, metallic top shield 68 overhangs an upper portion of inner shield 150 near target 22, and provides shielding of both an upper portion of inner shield 150 located closest to target 22 and the tubular-shaped support 158 to prevent them from being coated with sputtered material from target 22. Top shield 68 is electrically coupled to a grounded wall of chamber 10. A lower portion of inner shield 150 located near platform 24 is radially spaced between two vertically extending portions of a metallic bottom shield 70. Bottom shield 70 extends below inner shield 150 and shields a lower portion of chamber 10 near the movable platform 24 from bombardment with sputtered material. A central opening 72 in bottom shield allows platform 24 to be raised up into process position where the substrate contacts clamping ring 30 in the preferred embodiment. Bottom shield 70 is supported by a hangar 74 that is electrically coupled to the grounded wall 11 of chamber 10.

Top shield 68 and bottom shield 70 are each grounded so as to provide a return path for a DC current from sputtered ions. Top and bottom shields 68 and 70 also protect tubular-shaped support 158 and outer shield 154 from heat produced by the plasma and from bombardment by sputtered material. Metallic inner shield 150, on the other hand, floats electrically, with each segment isolated from the other segments so as not to provide a path for eddy currents to circulate around the circumference of inner shield 150 or around the slots 152.

Instead of bolting inner shield 150 directly onto the outer shield 154, one can use spacers (not shown) to separate inner shield 150 from outer shield 154. The spacers would eliminate the need to provide recesses 164 in outer shield 154. The spacers can be, for example, washers placed over fasteners 162 between inner shield 150 and outer shield 154. Inner shield 150 may also be removable with respect to a fixed outer shield 154 and coil 34 to facilitate cleaning or servicing of the shield 150 and shield assembly 48.

Figure 4:
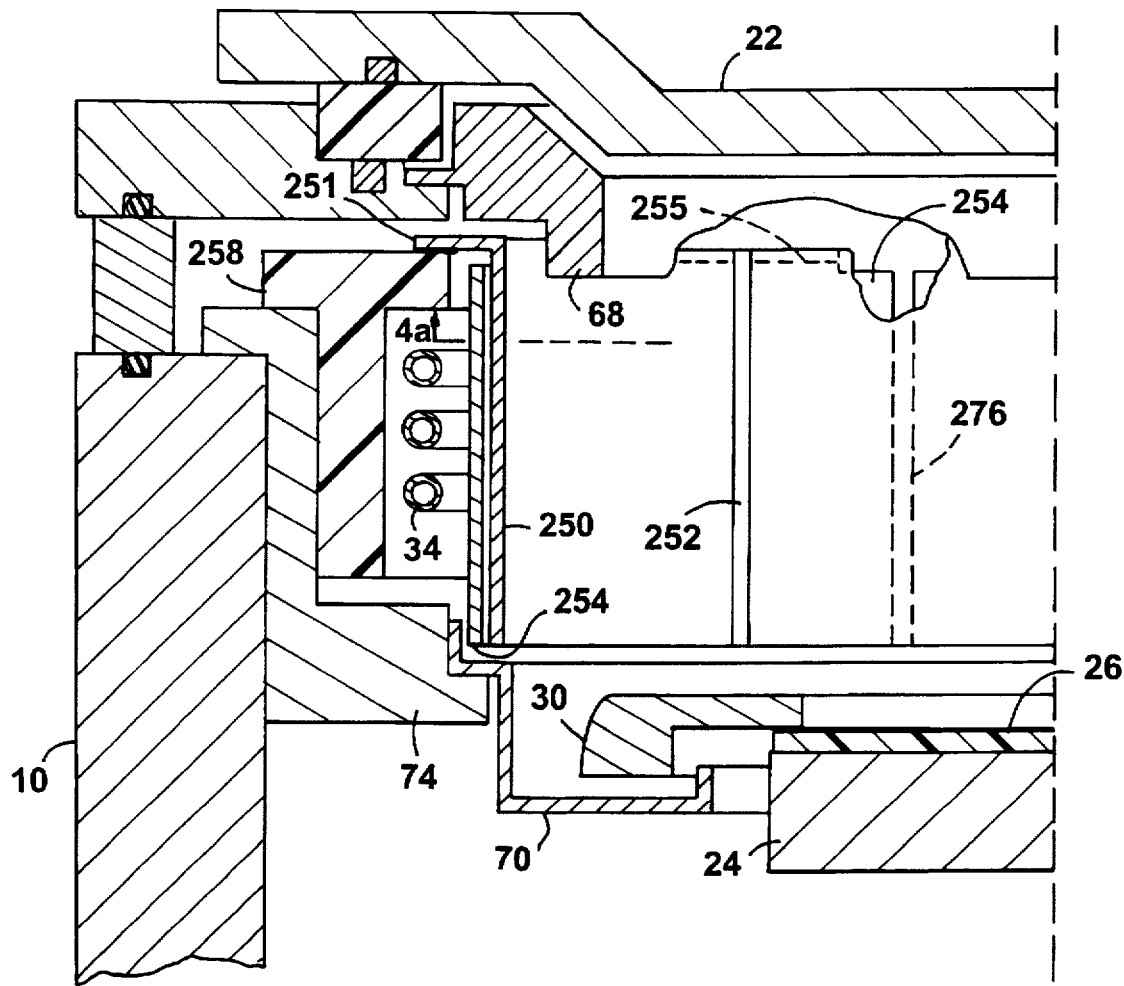
FIG. 4 is a partially broken away, sectional view of a portion of a plasma deposition system schematically illustrating another embodiment of a coil shield assembly according to the invention.

Referring now to FIG. 4, an alternative embodiment of a coil shield assembly 48 includes a slotted, metallic outer shield 254 interposed between and separated from each of inner shield 250 and coil 34. Outer shield 254 has a plurality of slots 276 that are circumferentially offset from an equal number of slots 252 in inner shield 250 such that there are no direct, line-of-sight paths between central space 35 and coil 34. Inner shield 250 and outer shield 254 are electrically isolated from each other and from ground. In addition, slots 252 pass completely through inner shield 250 from top to bottom so as to divide inner shield 250 into discrete, electrically isolated segments. Similarly, slots 276 pass completely through outer shield 254 from top to bottom and divide outer shield 254 into discrete, electrically isolated segments.

Coil 34 is supported in a generally tubular-shaped, insulating support 258 by, for example, projections (not shown) extending radially inward from insulating support 258.

Figure 4A:
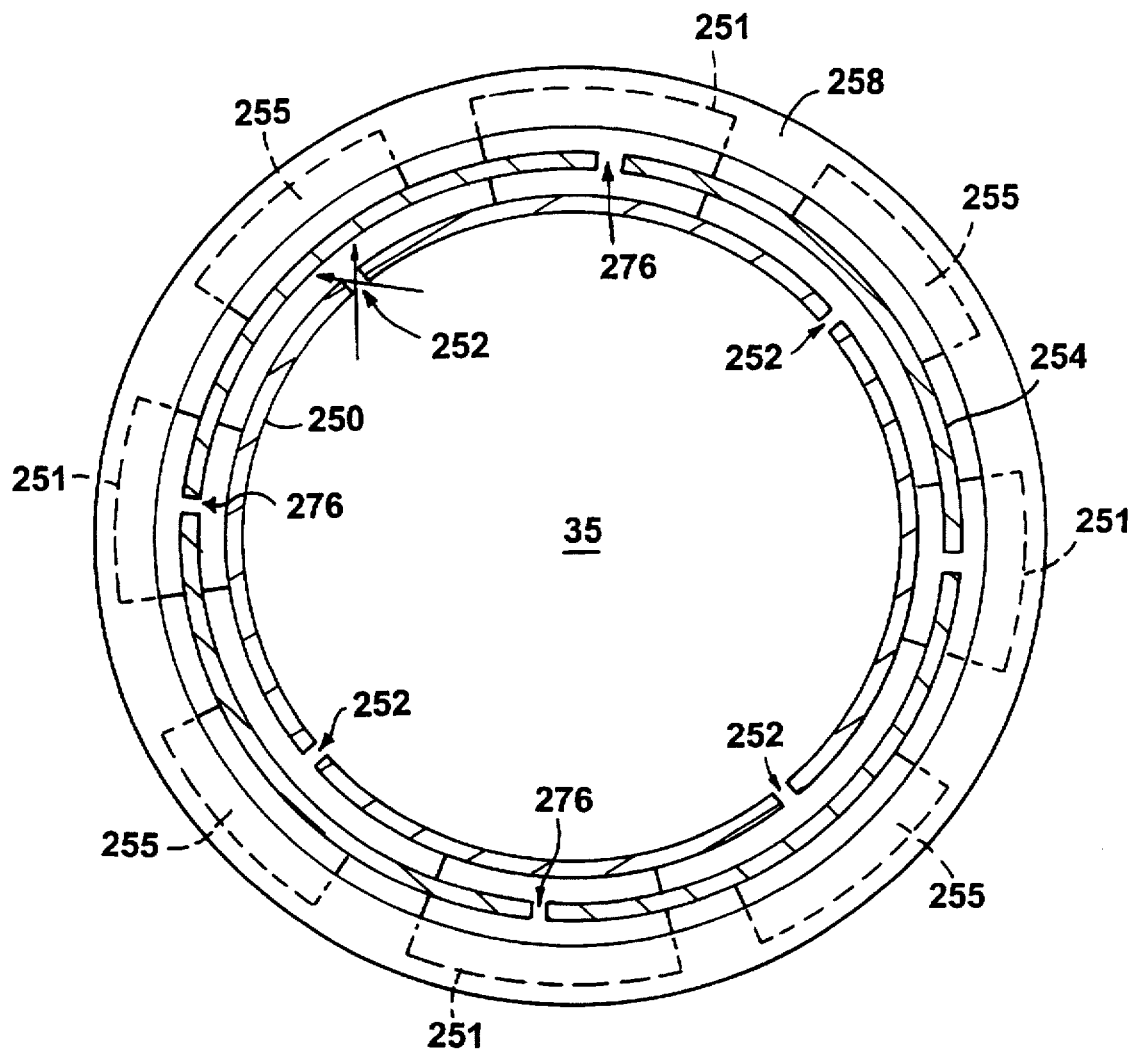
FIG. 4a is a sectional view along line 4a of a portion of the coil shield assembly.

Referring now also to FIG. 4a, at an upper end of each segment of inner shield 250, there is one or more radially extending tabs 251 that rest on insulating support 258 so as to hold that segment of inner shield 250 in place within chamber 10. Similarly, at an upper end of each segment of outer shield 254 there is one or more radially extending tabs 255 which hang on insulating support 258 to keep that outer shield segment in place. Tabs 251 and 255 are alternately positioned on insulating support 258 and electrically isolated from each other. Fasteners and insulating spacers or bushings (not shown) can be used to secure the segments of the inner and outer shields 250 and 254 onto support 258.

To simplify the drawing, FIG. 4a shows only four slots 252 in inner shield 250 and four slots 276 in outer shield 254. It should be understood, however, that this is not meant to be limiting and that in practice there could be more slots or there even could be fewer slots.

The arrows in FIG. 4a indicate projections of straight, line-of-sight paths that sputtered material or plasma ions may travel from central space 35 through one of slots 252. Slots 276 in outer shield 254 are sufficiently offset from slots 252 in inner shield 250 so that there is no line of sight path through the slots in both shield to coil 34. As indicated above, this prevents sputtered material and ions from reaching and depositing onto coil 34 during processing.

The embodiment illustrated in FIG. 4 does not include an insulating support positioned between coil 34 and outer shield 254 and supporting outer shield 254. However, that type of arrangement is also contemplated as being within the scope of the invention.

In each of the foregoing exemplary embodiments, coil 34 is positioned within chamber 10. Coil 34 is not a perfect conductor of RF power and it will exhibit some losses which generate heat. To facilitate removal of this heat, coil 34 is made from metal tubing (e.g. copper), and water or some other coolant is circulated through the coil during plasma processing.

Figure 5:
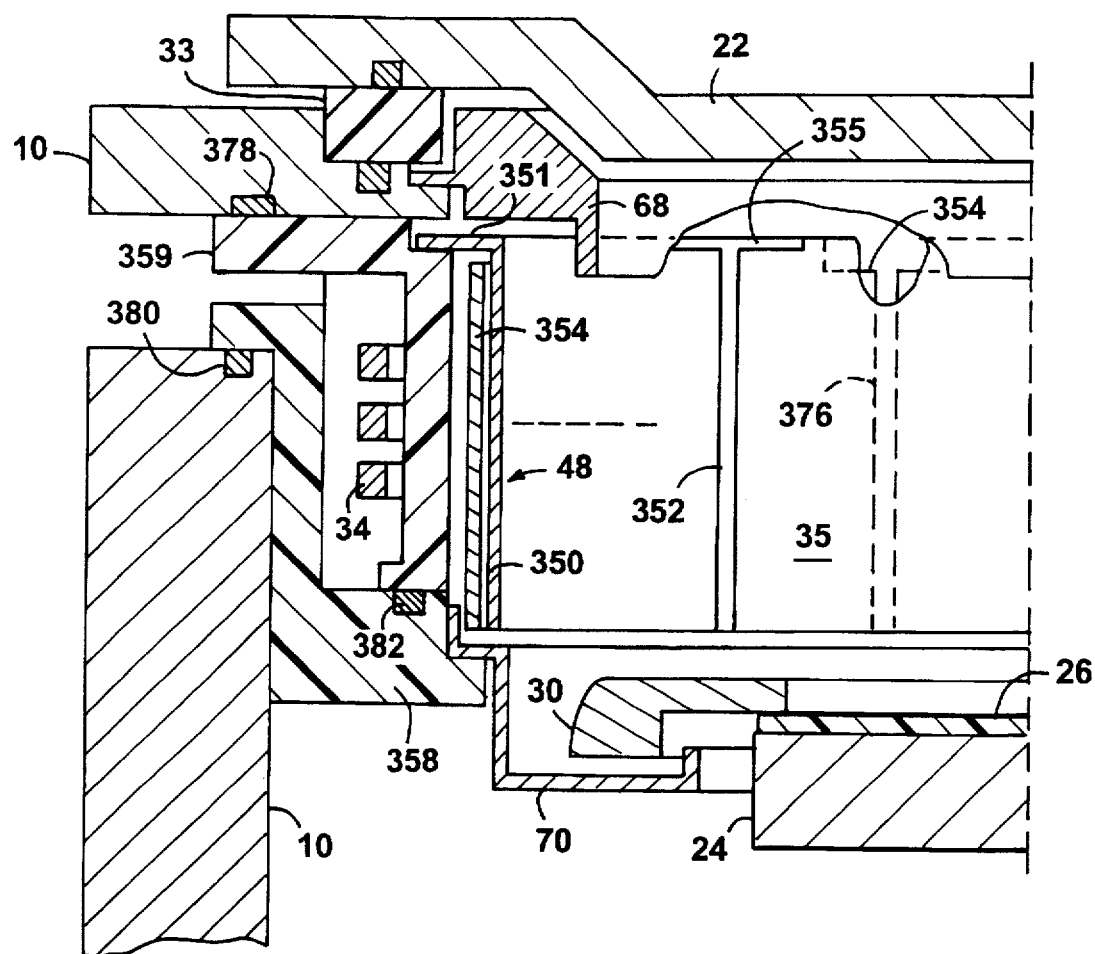
FIG. 5 is a partially broken away, sectional view of a portion of plasma deposition system schematically illustrating another embodiment of a coil shield assembly according to the invention.

Referring now to FIG. 5, in yet another embodiment, coil 34 of coil shield assembly 48 is located outside of chamber 10. In this configuration, convection cooling of coil 34 by the surrounding air will often be sufficient to cool coil 34 and thus the problems inherent in attempting to pass liquid to the coil through the chamber are prevented. A cylindrically-shaped outer support 358 is positioned radially outside coil 34 and is structured to support coil 34, for example, with inwardly extending pegs (not shown) or other suitable means. Another cylindrically-shaped inner support 359 is positioned radially inside coil 34 and functions as the outer wall of the vacuum chamber. Both outer support 358 and inner support 359 are made of a dielectric material (e.g. ceramic or quartz). O-rings 378, 380 and 382 form vacuum seals where the inner and outer supports 359 and 358 mate with other chamber components.

An inner shield 350 and an outer shield 354, both of which may be made of metal or another conductor, are positioned as closely as possible to inner support 359 and thus to coil 34. Outer shield 354 is positioned between insulating inner support 359 and inner shield 350, but without electrically contacting inner shield 350. A plurality of slots 352 extending through inner shield from top to bottom divide inner shield 350 into discrete, electrically isolated segments. A plurality of slots 376 circumferentially offset from slots 352 similarly divide outer shield 354 into discrete, electrically isolated segments. Shields 350 and 354 and their respective slots 352 and 376 are aligned such that there are no direct, line-of-sight paths between central space 35 and inner support 359. In addition, shields 350 and 354 are electrically isolated from each other and from ground. The segments of each shield 350 and 354 are each supported by tabs 351 and 355 which rest on the inner insulating support 359 in a manner similar to that described above in connection with FIG. 4a. Fasteners and insulating spacers (not shown) can be used to secure each segment of inner and outer shields to support 359.

Figure 6:
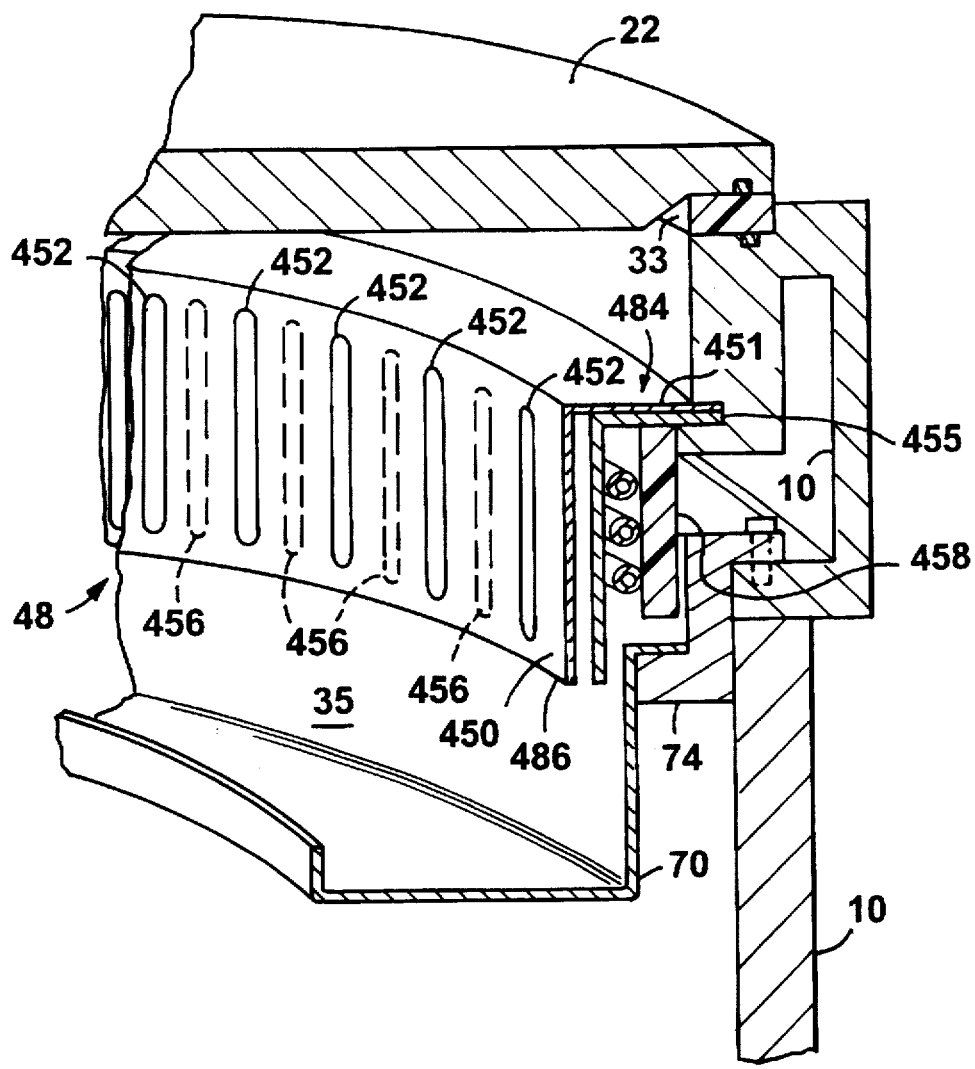
FIG. 6 is a partially sectioned, perspective view of a portion of a plasma deposition system schematically illustrating another embodiment of a coil shield assembly according to the invention.

Referring to FIG. 6, an alternative embodiment of a coil shield assembly 48 includes RF field coil 34 located within chamber 10. Structure for supporting RF coil 34 can be provided, for example, by a cylindrically-shaped, insulating support 458 having pegs (not shown) or other inwardly projecting structures holding the turns of coil 34. An inner shield 450 is positioned inside coil 34 and includes a plurality of slots 452 spaced evenly around the circumference of shield 450. In this embodiment, slots 452 pass through inner shield 450 however do not extend entirely from top to bottom of shield 450. Each slot 452 extends from a position just below a top edge the top of inner shield 450 to a position just above a lower end 486 of inner shield 450. A metallic outer shield 454 is positioned between inner shield 450 and coil 34 and is radially spaced apart from each. Outer shield 454 contains a plurality of evenly spaced apart, open slots 456 that are circumferentially offset from slots 452 of inner shield 450 so that there are no line of sight paths from central space 35 to coil 34. Both inner shield 450 and outer shield 454 may be made of metal.

Both inner shield 450 and outer shield 454 are grounded. In the embodiment illustrated in FIG. 6, each of inner shield 450 and outer shield 454 includes an outwardly extending lip at their upper ends, indicated in the drawing with reference characters 451 and 455, respectively, for supporting and attaching them to chamber 10. Since inner shield 450 is grounded it forms part of the return path for the sputter current. A bottom shield 70 is also provided to protect the bottom components of chamber 10 from being exposed to the sputtered material.

Slots 452 and 456 allow RF energy generated by RF field coil 34 to penetrate into central region 35 to produce a plasma. Inner and outer shields 450 and 454 protect coil 34 from the plasma, and block out direct deposition of material sputtered from target 22 onto coil 34.

Figure 7A:
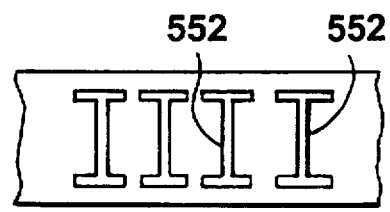
FIGS. 7a–c schematically illustrate different slot designs for use with the coil shield assembly illustrated in FIG. 6.
Figure 7B:
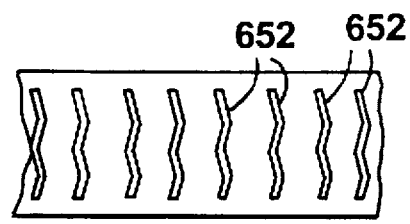
Figure 7C:
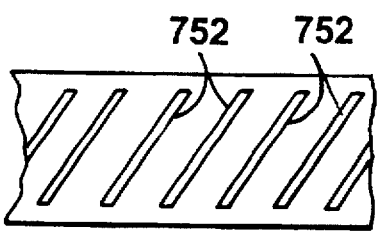

Although FIG. 6 shows slots 452 and 456 that are straight and vertically oriented (i.e., oriented parallel to the central axis of the chamber 10), other configurations are contemplated within the scope of the invention. Some other slot shapes that provide possibly better suppression of eddy currents in the metal shields include I-shaped slots 552 (FIG. 7a), herringbone-shaped slots 652 (FIG. 7b), and slanted lineshaped slots 752 (FIG. 7c). These more complexly shaped slots increase the length of the path over which the eddy currents must flow and thereby increase the resistance as seen by such currents.

Figure 8A:
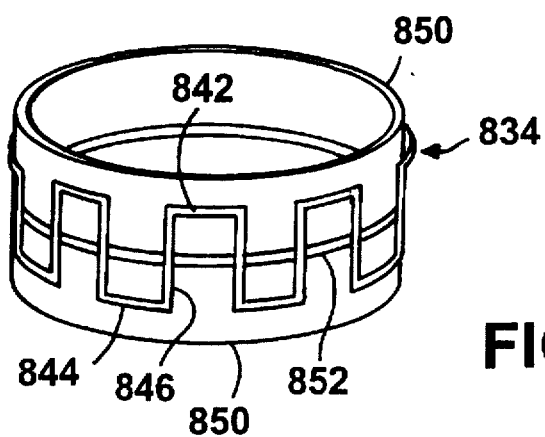
FIGS. 8a–c are perspective views of three embodiments of other types of coil shield assemblies according to the invention.
Figure 8B:
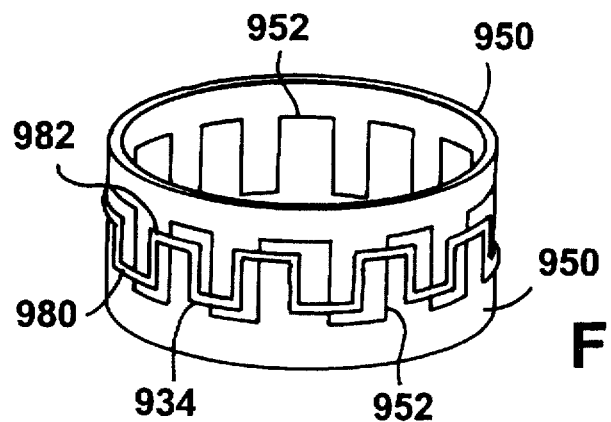
Figure 8C:
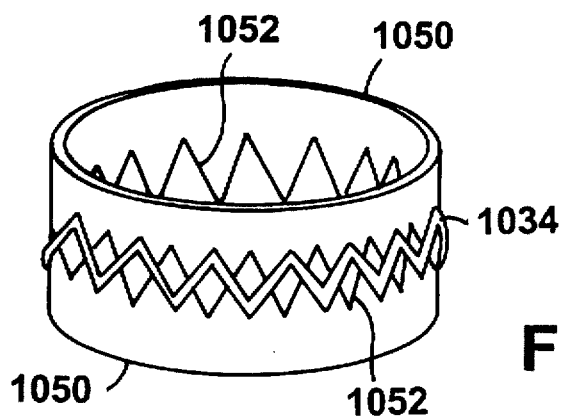

Referring to FIGS. 8a–c, another type of a slotted coil shield assembly includes a shield that has a circumferentially extending slot. The slot and RF field coil are each structured and arranged such that they are oriented substantially transverse to each other at circumferentially and axially aligned crossing points. Referring now to FIG. 8a, a single-turn RF field coil 834 is shaped in a repeating rectangular manner with circumferentially oriented coil portions 842 and 844 connected by axially extending coil portions 846. Shield 850 forms a circular slot 852 that divides shield 850 into two segments Coil 834 is positioned relative to circular slot 852 so that slot 852 is approximately mid-way between the coil portions 842 and 844. Thus, a radial projection of circular slot 852 onto coil 834 intersects only axial portions 846.

FIG. 8b illustrates a coil shield assembly in which both an RF field coil 934 and a generally circumferentially extending slot 952 in a shield 950 are shaped in a repeating rectangular manner. In this embodiment, the rectangular pattern of slot 952 has a larger amplitude than the rectangular pattern of coil 934. In addition, coil 935 and slot 952 are circumferentially offset from each other by about a quarter of a period so that if the pattern of slot 952 is projected onto coil 934, it intersects only circumferential portions 980 and 982 of coil 934.

FIG. 8c illustrates a coil shield assembly in which each of an RF field coil 1034 and a slot 1052 in a shield 1050 are sawtooth-shaped and offset from each other by about a quarter of a period. Thus, a radial projection of slot 1052 onto coil 1034 intersects coil 1034 at the midway point of each linear portion of its saw-tooth pattern.

In each of the foregoing examples of coil shield assemblies illustrated in FIGS. 8a–c, a barrier, or outer shield, can be interposed between the RF field coil and the shield. The barrier can be, for example, an insulating tube or a slotted metallic tube. It is also understood that the RF field coil may be embedded in the outer shield as previously described with reference to FIG. 2.

Figure 9:
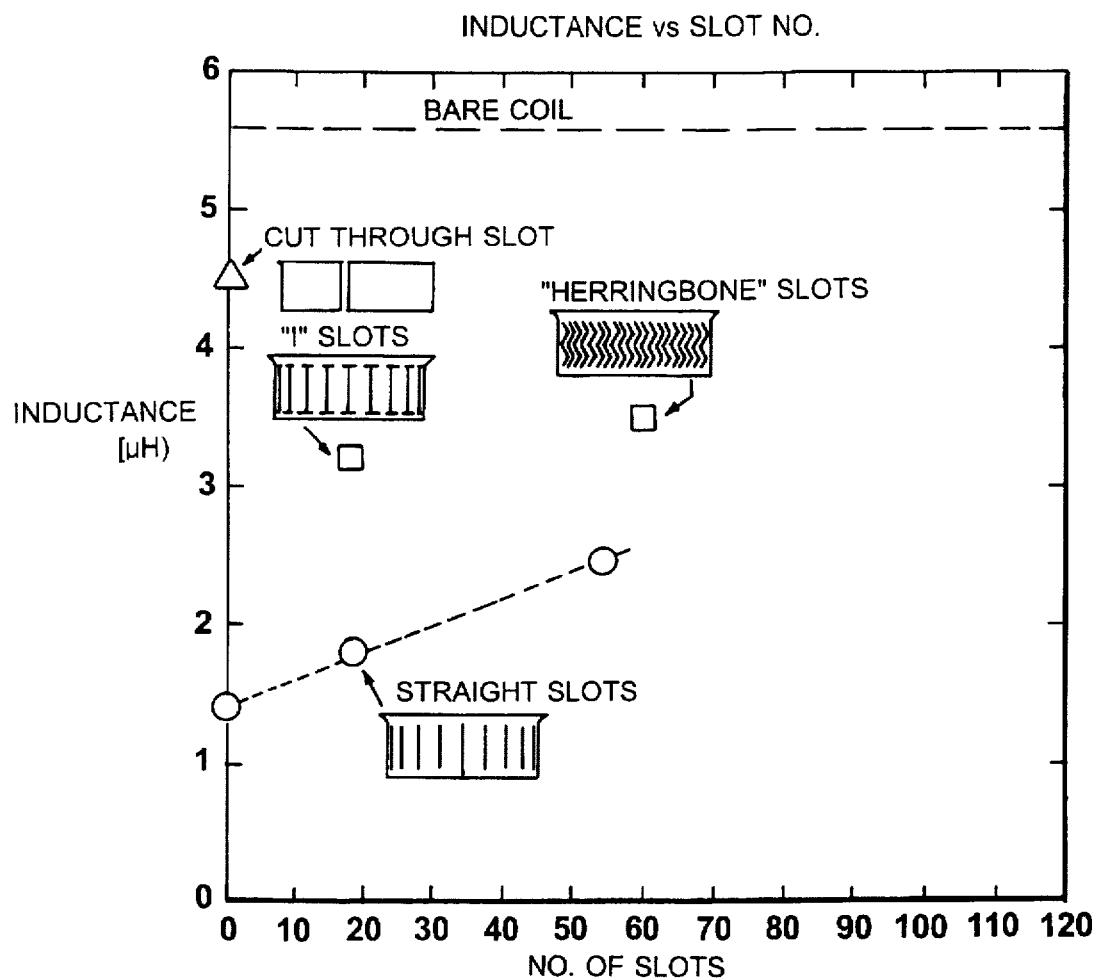
FIG. 9 is a plot of inductance in the plasma region versus the number of slots in a metallic coil shield for four different types of coil shield assemblies.

We measured the effectiveness of various coil designs in allowing RF energy from the coil to couple to the plasma. FIG. 9 shows the results of our experiments. First, we measured the inductance of a bare, turn coil at a typical operating frequency, in this case 2 MHz. We conducted this measurement with no nearby metal objects that could capacitively couple to the coil. The bare coil inductance is shown as a dashed line near the top of a plot of inductance vs. number of slots. We also measured the inductance for each of the illustrated shields placed inside the coil. The more effective the shield is in allowing RF energy to pass through into the plasma region, the smaller the drop in inductance as compared to the bare coil measurement. As can be seen, increasing the number of slots improves the coupling. Moreover, using slots of more elaborate designs (e.g. I-shaped slots or herringbone-shaped slots) also improves coupling. The greatest improvement, however, occurs by extending the slot so that it cuts entirely through the shield from top to bottom. Note that our measurements indicated that a shield with just a single "full cut" slot performed better than any of the designs in which there were multiple slots none of which passed all of the way through the shield from top to bottom.

In designing a coil shield assembly, two criteria are balanced in determining the width of the slots. First, the slots should be narrow enough so that there is no substantial plasma leakage through the slots., Second, the slots should be wide enough such that they will not be bridged by sputtered metal. A slot width of approximately 0.06 inches or greater is generally sufficient to prevent bridging occurring more often than one or more cleaning cycles of a process system.

In the coil shield assemblies discussed above with reference to FIGS. 4–6 in which each of the inner and outer shields are metallic, the slots for the outer shield can be narrower since these slots are not exposed to sputtered material. The inner shield and outer shield should also be radially spaced so as to prevent the formation of a bridging material layer between the two shields during use. It is also apparent that the inner and/or outer shields of the present invention may be conveniently removeably positioned within the chamber.

An additional design consideration is the spacing between the metallic shields and the coil. In general, it is desirable to position the coil as close as possible to the inner metallic shield so as to achieve the maximum coupling to the plasma within the chamber.

The metallic shields can be made of any type of metal compatible with the process undertaken in the chamber. In choosing a material, one may consider the material being sputter deposited and choose a shield material that the sputtered material will adhere to such as to inhibit contamination of the chamber by flaking. One may also want to choose a shield material that is compatible with a chemical process to remove the sputtered on material so that the shields can be re-used. These factors are generally known to those of ordinary skill in the art.

The RF field coil can be just a single winding or it can have multiple windings. The number of windings will generally be a compromise between power loss and impedance matching, and will therefore depend upon the RF frequency of operation.

Although the embodiments of the invention discussed above are illustrated in a sputter deposition system, it should be understood that the coil shield assembly can also be used in other types of plasma processing systems. Other embodiments are within the following claims.

What is claimed is:

1. A plasma processing system comprising:
   a vacuum chamber;
   an RF field coil surrounding a central space within the vacuum chamber, during processing said RF coil coupling RF power into a plasma within the central space; and a coil shield assembly shielding the coil from the plasma, said coil shield assembly comprising a first shield located inside the RF field coil and having at least one slot extending therethrough, wherein the first shield is located relative to the chamber so as to be exposed to the plasma during operation, and a barrier structure positioned between the first shield and the coil and aligned with the at least one slot, wherein the first shield and the barrier are structured and arranged to inhibit bridging of the at least one slot by material deposited in the chamber during plasma processing.

2. The plasma processing system of claim 1, wherein said first shield and said barrier are integrally formed.

3. The plasma processing system of claim 2, wherein said at least one slot is T-shaped.

4. The plasma processing system of claim 1, wherein an inner surface of the barrier structure is spaced apart from the first shield proximal to the at least one slot, and positioned such that the surface of the barrier structure blocks all line-of-sight paths through the at least one slot between the central space and the coil.

5. The plasma processing system of claim 4, wherein the at least one slot extends from a position proximate a top edge of the first shield to a position proximate a bottom edge of the first shield.

6. The plasma processing system of claim 5, wherein the at least one slot comprises a plurality of slots circumferentially spaced around the first shield.

7. The plasma processing system of claim 6, wherein each of the slots of the plurality of slots has a shape which is a member of the group of shapes consisting of an I-shape, a straight line shape, and a herring bone-shape.

8. The plasma processing system of claim 6, wherein said first shield is metallic.

9. The plasma processing system of claim 8, wherein the first shield is grounded.

10. The plasma processing system of claim 8, wherein the barrier structure comprises a second metallic shield including a plurality of slots circumferentially spaced around the second shield and extending therethrough, and wherein the plurality of slots in the second shield are circumferentially offset from the plurality of slots in the first shield.

11. The plasma processing system of claim 4, wherein the at least one slot in the first shield extends completely through the first shield from top to bottom thereby splitting the first shield.

12. The plasma processing system of claim 11, wherein the at least one slot in the first shield comprises a plurality of circumferentially spaced slots which divide the first shield into individual segments.

13. The plasma processing system of claim 12, wherein each segment of the first shield is electrically isolated from each of the other segments of the first shield.

14. The plasma processing system of claim 10, wherein the barrier structure comprises a dielectric material and provides support to the first shield.

15. The plasma processing system of claim 14, wherein the surface of the barrier structure includes a recess aligned with and proximate to the at least one slot of the first shield.

16. The plasma processing system of claim 14, wherein an inner surface of the barrier structure is spaced apart from the first shield.

17. The plasma processing system of claim 10, wherein the barrier structure comprises a second shield positioned between the first shield and the coil, the second shield including at least one slot extending therethrough, wherein the at least one slot of the second shield extends from a position proximate a top edge of the second shield to a position proximate a bottom edge of the second shield and wherein the at least one slot of the second shield is circumferentially offset from the at least one slot of the first shield.

18. The plasma processing system of claim 17, wherein the second shield is metallic.

19. The plasma processing system of claim 18, wherein the coil shield assembly includes a dielectric wall positioned between the second shield and the coil.

20. The plasma processing system of claim 19, wherein the dielectric wall positioned between the second shield and the coil forms a wall of the chamber so that the RF coil is located outside of the vacuum chamber.

21. The plasma processing system of claim 4, wherein the at least one slot extends in a generally circumferential direction around the first shield.

22. The plasma processing system of claim 21, wherein the RF field coil and the at least one slot are circumferentially and axially aligned at a plurality of circumferentially spaced crossing points at which the at least one slot is substantially transverse to the RF field coil.

23. The plasma processing system of claim 22, wherein the RF field coil is configured into a substantially rectangular-shaped pattern.

24. The plasma processing system of claim 23, wherein the slot is substantially circular.

25. The plasma processing system of claim 24, wherein the at least one slot has a periodic rectangular-shaped pattern and is out of phase with the substantially rectangular-shaped pattern of the coil.

26. The plasma processing system of claim 21, wherein the RF field coil defines a substantially sawtooth-shaped first pattern, and wherein the slot defines a substantially sawtooth-shaped second pattern that is out of phase with the substantially sawtooth-shaped first pattern of the RF field coil.

27. A plasma processing system for sputter depositing a material from a target onto a substrate, said system comprising:
vacuum chamber;
a platform which holds the substrate during plasma processing;
a sputter source onto which the target is mounted;
an RF coil located inside of the chamber and located between the target and the platform; and
a coil shield assembly comprising a first shield located inside the RF coil and a barrier structure located between the first shield and the RF coil, the first shield having at least one slot extending therethrough and positioned relative to the vacuum chamber so as to be exposed to sputter-deposited material during operation, and said barrier structure located between the first shield and the RF coil, aligned with the at least one slot, and spaced from the first shield proximal to the at least one slot such that there is no line of sight path from inside of the first shield to the RF coil.

28. The plasma processing system of claim 27, wherein the first shield is metallic.

29. The plasma processing system of claim 28, wherein the at least one slot comprises a first plurality of circumferentially spaced slots, and wherein the barrier structure comprises a second shield having a second plurality of circumferentially spaced slots extending therethrough and circumferentially offset from the first plurality of slots.

30. The plasma processing system of claim 29, wherein the second shield is metallic.

31. The plasma processing system of claim 27, wherein the barrier structure is made of an electrically insulating material and supports the first shield, the barrier structure having an inner surface in which there is formed a recess aligned with the at least one slot so as to inhibit bridging of the at least one slot by a material sputter deposited onto the inner surface of the barrier during plasma processing.

32. The plasma processing system of claim 31, wherein the at least one slot consists of a single slot that splits the first shield.

33. The plasma processing system of claim 31, wherein the at least one slot comprises a plurality of circumferentially spaced slots such that the first shield is segmented.

34. The plasma processing system of claim 27, wherein the at least one slot extends in a generally circumferential direction around the first shield.

35. The plasma processing system of claim 34, wherein the RF field coil and the at least one slot are aligned at a plurality of circumferentially spaced crossing points at which the at least one slot is substantially transverse to the RF field coil.

36. A plasma processing system comprising:
 a chamber for containing a plasma;
 an RF field coil positioned outside the chamber; and
 a coil shield assembly, comprising:
  a dielectric wall forming a portion of a wall of the chamber inside the coil; and
  a first shield inside the chamber and positioned so as to be exposed to the plasma during operation, the first shield being split by a first slot extending in an axial direction, wherein the first shield is spaced apart from an inner surface of the dielectric wall near the first slot.

37. The plasma processing system of claim 36, wherein the first shield is metallic.

38. The plasma processing system of claim 37, wherein said coil shield assembly further comprises a second metallic shield positioned between the dielectric wall and the first shield and spaced apart from the first shield, the second shield being split by a second slot that is circumferentially offset from the first slot.

39. The plasma processing system of claim 38, wherein the first slot is one of a first plurality of slots that divide the first shield into a first plurality of circumferentially spaced segments, wherein the second slot is one of a second plurality of slots that divide the second shield into a second plurality of circumferentially spaced segments, and wherein each of the first plurality of slots is circumferentially offset from each of the second plurality of slots.

40. The plasma processing system of claim 38, wherein the first and second shields are electrically isolated from each other and from ground.

41. An apparatus for use in depositing a conductive material onto a workpiece comprising:
 a chamber including an outer chamber wall and an inner chamber wall; and
 an induction coil surrounding at least part of the outer chamber wall and connected during operation to a current supply to create a plasma within the chamber containing ionized elements of a gas,
 wherein said inner chamber wall is formed of a nonconductive material, is removably positioned within the outer chamber wall so that as to be exposed to the plasma during operation, and is structured such that formation of a continuous conductive film around any inner perimeter of said inner chamber wall during deposition of the material onto the workpiece is prevented.

42. An apparatus according to claim 41, wherein said inner chamber wall exhibits at least one recessed opening along an inner surface thereof.

43. An apparatus according to claim 42, wherein said at least one recessed opening is T-shaped.

44. An apparatus according to claim 42, wherein said at least one recessed opening comprises a plurality of recessed openings.

45. An apparatus according to claim 42, wherein said inner chamber wall is comprised of a non-conductive material.

46. The apparatus according to claim 45, wherein said nonconductive material is ceramic.

47. The apparatus according to claim 45, wherein said nonconductive material is quartz.

48. An apparatus for use in depositing a conductive material onto a workpiece comprising:
 a chamber for containing ionized elements of a gas, said chamber comprising a cylindrical chamber wall and a chamber wall extension extending upwardly from an upper edge of the chamber wall, said chamber wall extension including an induction coil embedded therein and during operation connected to a current supply to create a plasma within the chamber containing ionized elements of a gas; and
 a shield surrounding the plasma, concentric to the chamber wall extension, and positioned inside of the chamber wall extension, said shield having an inner surface that is exposed to the plasma during operation and being structured to prevent formation of a continuous conductive film around any inner perimeter of the inner surface of the shield during deposition of the conductive material onto the workpiece.

49. The apparatus according to claim 48, wherein said chamber wall extension is comprised of a non-conductive material.

50. The apparatus according to claim 49, wherein said nonconductive material is ceramic.

51. The apparatus according to claim 49, wherein said nonconductive material is quartz.

52. The apparatus according to claim 48, wherein said shield comprises a cylinder, formed of a non-conductive material and removably positioned within the chamber, and further comprising at least one slot.

53. The apparatus according to claim 52, wherein the at least one slot comprises a plurality of slots circumferentially spaced around said shield.

54. The apparatus according to claim 53, wherein each of said plurality of slots is T-shaped.

55. The apparatus according to claim 54, wherein the cylinder is ceramic.

56. An apparatus for use in depositing a conductive material onto a workpiece comprising:
 a chamber for receiving the workpiece for deposition of the conductive material thereon;
 means for creating a plasma within the chamber; and
 shield means inside of the chamber and establishing an inner surface that is exposed to the plasma during operation, said shield means structured to prevent formation of a continuous conductive film around any inner perimeter of the inner surface during deposition of the material onto the workpiece.

57. The apparatus according to claim 56, wherein said shield means comprises a cylinder, formed of a non-conductive material and further comprising at least one slot.

58. The apparatus according to claim 57, wherein said at least one slot is T-shaped.

59. The apparatus according to claim 57, wherein said shield means is removably positioned within the chamber.

60. The apparatus according to claim 59, wherein the at least one slot comprises a plurality of slots circumferentially spaced around said shield means.

61. The apparatus according to claim 57, further comprising an RF field coil, said RF field coil at least partially embedded in said chamber.

62. An apparatus for coupling RF energy to a gas to create a plasma such that particles are emitted from a target material, comprising:

an RF field coil, at least partially surrounding a space where the plasma is created; and a first shield, wherein an inner portion of the shield is exposed to the plasma, the shield further having at least one slot extending therethrough, for shielding said RF field coil from the plasma and target material particles, wherein the at least one slot prevents a continuous film of plasma and target material particles from forming on any inner perimeter of the shield.

63. The apparatus according to claim 62, wherein said first shield comprises a cylinder, and the at least one slot comprises a plurality of slots circumferentially spaced around said shield.

64. The apparatus according to claim 62, further comprising a second shield positioned between said first shield and said RF field coil, said second shield also having at least one slot extending therethrough, wherein the at least slot on said second shield is circumferentially offset from the at least one slot on said first shield.

* * * * *